US012631948B2

(12) United States Patent (10) Patent No.: US 12,631,948 B2
Zhang et al. (45) Date of Patent: May 19, 2026

(54) MICRO DISPLAY MODULES, PROJECTORS, SYSTEMS AND METHODS THEREOF

(71) Applicant: Hue Inc., Shanghai (CN)

(72) Inventors: Shuai Zhang, Shanghai (CN); Huiwen Xu, Shanghai (CN)

(73) Assignee: Hue Inc., Shanghai (CN)

( * ) Notice: Subject to any disclaimer, the term of this patent is extended or adjusted under 35 U.S.C. 154(b) by 315 days.

(21) Appl. No.: 18/203,911

(22) Filed: May 31, 2023

(65) Prior Publication Data

US 2023/0393454 A1 Dec. 7, 2023

(30) Foreign Application Priority Data

Jun. 2, 2022 (WO) ................ PCT/CN2022/096931

(51) Int. Cl.
*G03B 21/20* (2006.01)
*H01L 25/075* (2006.01)
(Continued)

(52) U.S. Cl.
CPC ...... *G03B 21/2033* (2013.01); *H01L 25/0753* (2013.01); *H10H 20/855* (2025.01); *H10H 20/857* (2025.01)

(58) Field of Classification Search
CPC .. G03B 21/00; G03B 21/145; G03B 21/2013; G03B 21/2033; H10H 20/80; H10H 20/85; H10H 20/855; H01L 25/0753; H01L 25/167; H04N 9/3135; H04N 9/3138; H04N 9/3141; H04N 9/3161; H04N 9/3164; H04N 9/3188
See application file for complete search history.

(56) References Cited

U.S. PATENT DOCUMENTS

2009/0051993 A1* 2/2009 Ito .................. G02B 26/127
359/204.4
2019/0319020 A1 10/2019 Pan
(Continued)

FOREIGN PATENT DOCUMENTS

CN 102004388 A 4/2011
CN 211043914 U 7/2020
(Continued)

OTHER PUBLICATIONS

International Search Report and Written Opinion of PCT Application No. PCT/CN2022/122529, dated Mar. 8, 2023.

*Primary Examiner* — Sultan Chowdhury

(74) *Attorney, Agent, or Firm* — FINNEGAN, HENDERSON, FARABOW, GARRETT & DUNNER LLP

(57) ABSTRACT

A micro display module, a projector, and a system are provided. The micro display module includes a micro LED display device including at least one micro LED (light emitting diode) panel, wherein the at least one micro LED panel includes an IC back plane and a micro LED array area having one or more micro LEDs, the micro LED array area is formed on the IC back plane and each of the micro LEDs is electrically connected with the IC (integrated circuit) back plane; and an image light rotating element including a transmission lens arranged facing the micro LED array area and a lens position rotating actuator configured to rotate the transmission lens based on at least one preset axis, wherein the preset axis is parallel to the micro LED array area.

20 Claims, 17 Drawing Sheets

(51) Int. Cl.
    *H10H 20/855*    (2025.01)
    *H10H 20/857*    (2025.01)

(56)         References Cited

U.S. PATENT DOCUMENTS

| | | | |
|---|---|---|---|
| 2021/0199949 A1* | 7/2021 | Choi | G03B 21/2033 |
| 2021/0367095 A1* | 11/2021 | Jiang | G02B 26/0875 |
| 2021/0399161 A1* | 12/2021 | Jiang | H01L 21/67144 |
| 2022/0045248 A1* | 2/2022 | Liao | H01L 25/167 |
| 2022/0063196 A1 | 3/2022 | Steege | |
| 2022/0201257 A1* | 6/2022 | Huang | G03B 21/005 |
| 2022/0238595 A1* | 7/2022 | Kobayashi | H10H 29/142 |

FOREIGN PATENT DOCUMENTS

| | | |
|---|---|---|
| CN | 111564546 A | 8/2020 |
| CN | 111873433 A | 11/2020 |
| CN | 114932680 A | 8/2022 |
| TW | 200730878 A | 8/2007 |
| TW | 200808069 A | 2/2008 |
| TW | 201129850 A | 9/2011 |
| TW | 202131675 A | 8/2021 |

\* cited by examiner

X

0021

$$\Delta y = t \sin \theta \left(1 - \sqrt{\frac{1 - \sin^2 \theta}{n^2 - \sin^2 \theta}}\right)$$

MICRO DISPLAY MODULES, PROJECTORS, SYSTEMS AND METHODS THEREOF

CROSS-REFERENCE TO RELATED APPLICATIONS

The present disclosure claims priority to and the benefits of PCT Application No. PCT/CN2022/096931, filed on Jun. 2, 2022, which is incorporated herein by reference in its entirety.

TECHNICAL FIELD

The present disclosure generally relates to micro display technology, more particularly, to a micro display module, a micro display projector, and a micro display system based on the micro display module.

BACKGROUND

A self-emitting micro LED panel, as a micro display module, includes a micro LED (light emitting diode) array and an IC back plane that is connected with each of the micro LEDs as pixels in the micro LED array for image display. The diameter of the micro LED can be made to be less than 5 micro meters by the present semiconductor technology, thereby improving the integrity and image quality of the display panel compared with the conventional display panel, such as LCDs (liquid crystal displays).

However, neither of the number of the micro LEDs in a certain area of the micro LED panel nor the resolution of the micro LED panel can be increased due to the limitation of the photolithographic technology, which cannot facilitate the microminiaturization application of the micro LED panel based device, such as in head mounted display device, head-up display device or any other near-eye display device.

The above content is only used to assist in understanding the technical solutions of the present application, and does not constitute an admission that the above is prior art.

SUMMARY OF THE DISCLOSURE

In order to overcome the drawbacks, set forth above, the present disclosure provides a micro display module, a micro display projector, a micro display system, and a micro displaying method to, for example, solve the problem that the resolution of the micro LED array cannot be increased in a certain area of the micro LED panel.

The present disclosure provides a micro display module. The micro display module includes a micro LED display device including at least one micro LED (light emitting diode) panel, wherein the at least one micro LED panel includes an IC back plane and a micro LED array area having one or more micro LEDs, the micro LED array area is formed on the surface of the IC back plane and each of the micro LEDs is electrically connected with the IC (integrated circuit) back plane; and an image light rotating element including a transmission lens arranged facing the micro LED array area and a lens position rotating actuator configured to rotate the transmission lens based on at least one preset axis, wherein the preset axis is parallel to the micro LED array area.

The present disclosure further provides a micro display projector. The micro display projector includes an above-mentioned micro display module, and a lens group, arranged facing the micro display module for receiving image light emitted from the micro display module.

The present disclosure also provides a micro display system. The micro display system includes an above-mentioned micro display module, configured to emit image light from the micro LED array area; and a controlling unit, connected with the micro LED display device and the image light rotating element; wherein the controlling unit is configured to transmit objective image data to the micro LED display device and the image light rotating element.

BRIEF DESCRIPTION OF THE DRAWINGS

Embodiments and various aspects of the present disclosure are illustrated in the following detailed description and the accompanying figures. Various features shown in the figures are not drawn to scale.

DETAILED DESCRIPTION

Reference will now be made in detail to the present preferred embodiments to provide a further understanding of the disclosure. The specific embodiments and the accompanying drawings discussed are merely illustrative of specific ways to make and use the disclosure, and do not limit the scope of the disclosure or the appended claims.

Figure 1:
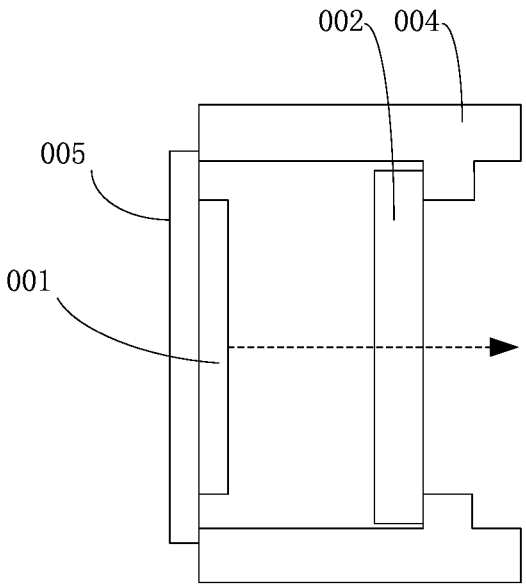
FIG. 1 is a cross sectional structure of a micro display module, according to some embodiments of the present disclosure.

To resolve the problems in the related technologies, a micro display module is provided in the present disclosure in some embodiments. FIG. 1 is a cross sectional structure of a micro display module, according to some embodiments of the present disclosure. Referring to FIG. 1, the micro display module includes a micro LED display device 001 and an image light rotating element 002. A stiffening plate 005 is formed at the back of the micro LED display device for supporting the micro LED display device 001. A mounting frame 004 connects the stiffening plate 005 with the image light rotating element 002. Furthermore, the mounting frame 004 includes a first chamber and a second chamber. The image light rotating element 002 is arranged in the first chamber and the micro LED display device 001 is arranged in the first chamber facing the image light rotating element 002. In some embodiments, the micro LED display device 001 is arranged at the edge of the first chamber and the edge of the stiffening plate 005 is adhesive on one edge of the mounting frame 004 by a conventional binder. Additionally, the first chamber and the second chamber are separated by an inner protrusion protruded from the inner sidewall of the mounting frame 004. The first chamber and the second chamber are connected to form a light channel for image light, so the protrusion cannot shield the image light emitted from a transmission lens. The edge of the image light rotating element 002 is adhesive on one sidewall of the inner protrusion by a conventional binder, glue or any other adhesive. The micro LED display device 001 can further include an IC back plane (integrated circuit) and a micro LED array area having one or more micro LEDs. The micro LED array area is formed on the surface of the IC back plane and each of the micro LEDs is electrically connected with the IC (integrated circuit) back plane. Preferably, the micro LED array area is metal bonded with the surface of the IC back plane.

Figure 2:
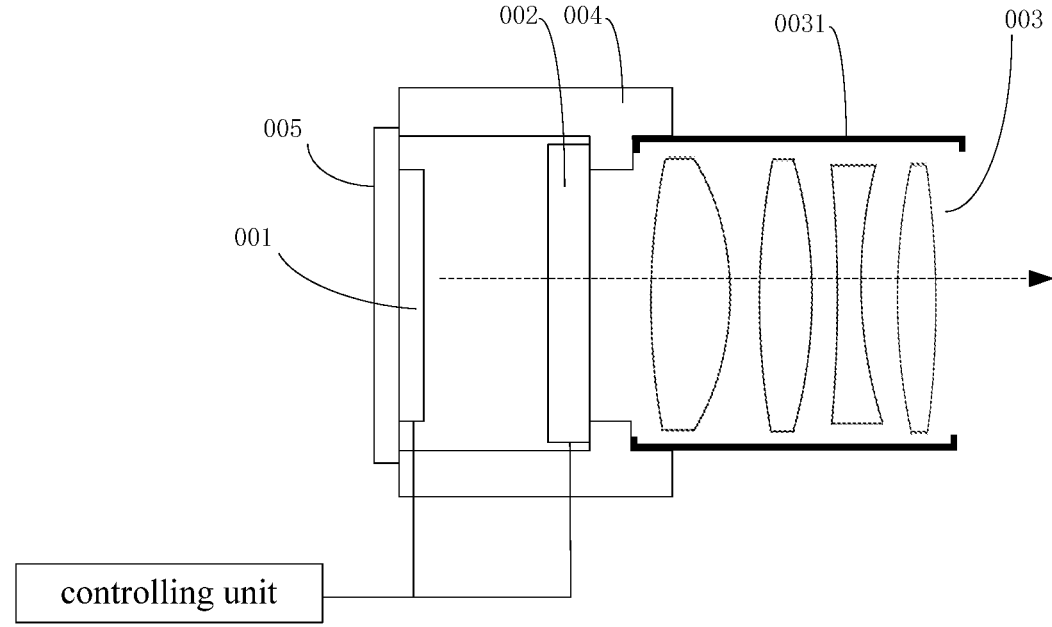
FIG. 2 is a cross sectional structure of a micro display projector, according to some embodiments of the present disclosure.

FIG. 2 is a cross sectional structure of a micro display projector, according to some embodiments of the present disclosure. Referring to FIG. 2, the micro display module can be used for a micro display projector. The micro display projector disclosed herein in some embodiments includes the aforementioned micro display module and a lens group 003. The lens group 003 is arranged facing the micro display module for receiving the image light emitted from the micro display module. The lens group 003 is arranged and supported in a column. The edge of the column 0031 is fixed on the mounting frame 004. Furthermore, the edge of the column 0031 is inserted into and adhesive on the other sidewall of the protrusion in the second chamber. Additionally, the body of the column extends outside of the second chamber. In some embodiments, the diameter of at least one lens of the lens group 003 is not less than the diagonal line of the micro LED array area, and not less than the diameter of the transmission lens.

Figure 3:
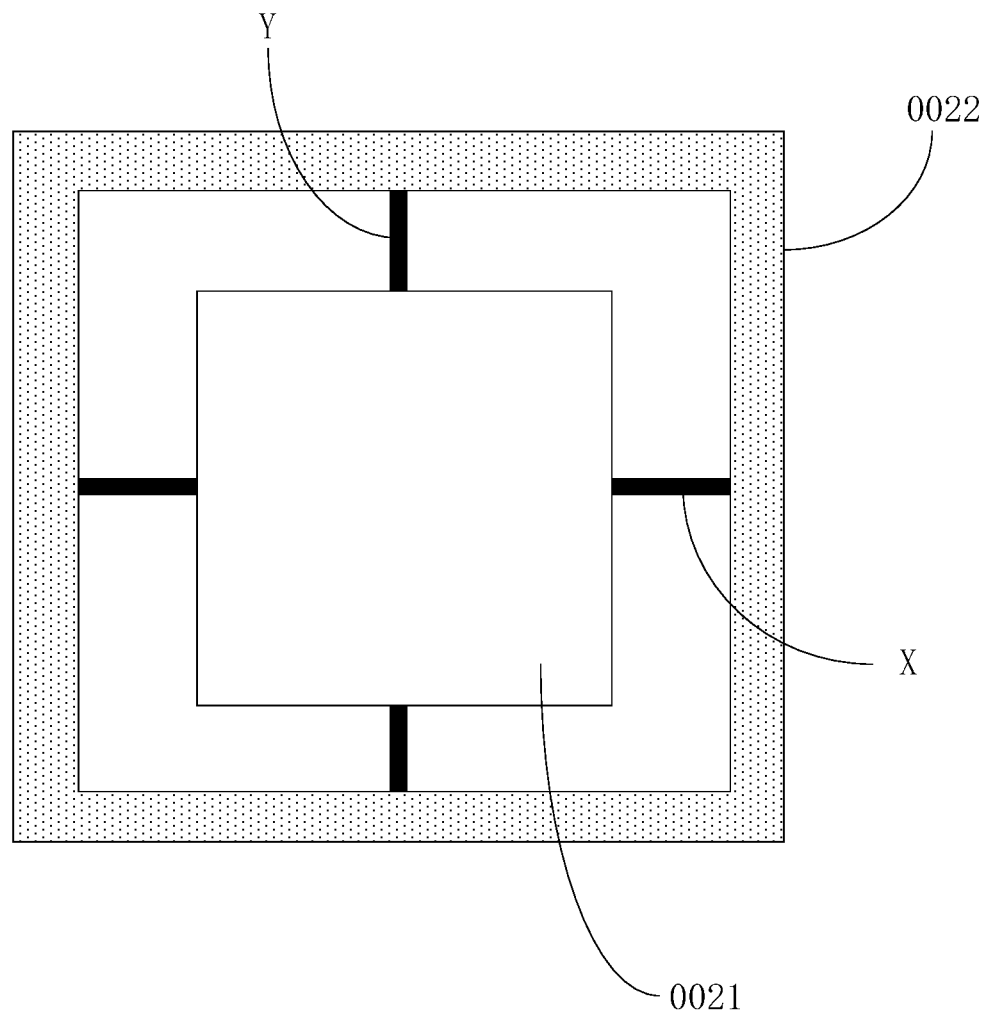
FIG. 3 is a schematic structure of an image light rotating element, according to some embodiment of the present disclosure.

FIG. 3 is a schematic structure of an image light rotating element, according to some embodiment of the present disclosure. Referring to FIG. 3, the image light rotating element includes a transmission lens 0021 and a lens position rotating actuator 0022. The transmission lens 0021 is arranged facing the micro LED array area, in consistent with FIG. 1. The lens position rotating actuator 0022 is connected with the transmission lens 0021 by at least one preset axis. The preset axis is parallel to the micro LED array area. As disclosed herein, the preset axis includes an X axis and a Y axis.

Figure 4:
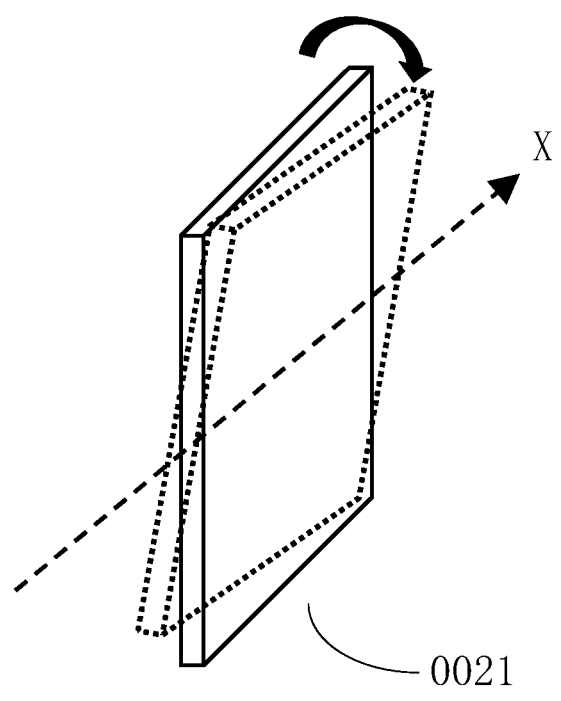
FIG. 4 illustrates a rotating transmission lens based on X axis, according to some embodiments of the present disclosure.

FIG. 4 illustrates a rotating transmission lens based on X axis, according to some embodiments of the present disclosure. Referring to FIG. 4, the transmission lens 0021 can be rotated based on the X axis by the lens position rotating actuator; for example, the lens position rotating actuator produces a magnetic field to rotate the transmission lens 0021 based on the X axis, which can be understood by those skilled in the art and will not be described herein. In some embodiments, the X axis is parallel to the micro LED array area in a first direction.

Figure 5:
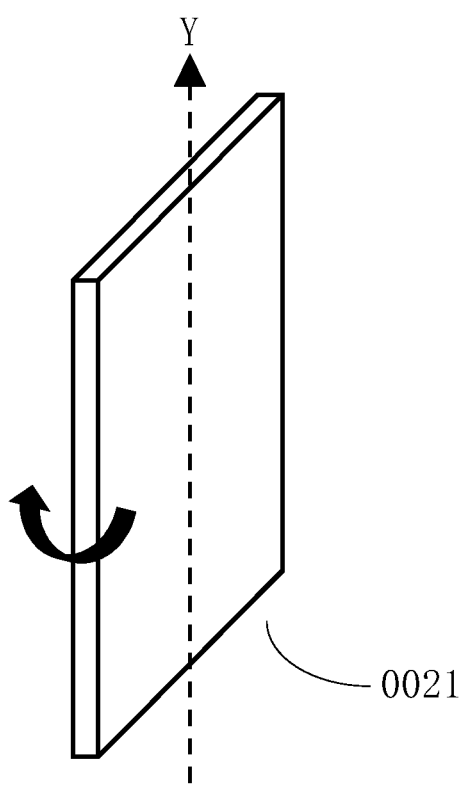
FIG. 5 illustrates a rotating transmission lens based on Y axis, according to some embodiments of the present disclosure.

FIG. 5 illustrates a rotating transmission lens based on Y axis, according to some embodiments of the present disclosure. Referring to FIG. 5, the transmission lens 0021 can further be rotated based on the Y axis by the lens position rotating actuator; for example, the lens position rotating actuator produces a magnetic field to rotate the transmission lens 0021 based on the Y axis, which can be understood by those skilled in the art and will not be described herein. As disclosed herein, the Y axis is parallel to the micro LED array area in a second direction. The first direction is not parallel with the second direction. In some embodiments, the first direction is perpendicular to the second direction, so the X axis is perpendicular to the Y axis. For example, the X axis is along a horizontal direction and the Y axis is a vertical direction.

Referring to FIGS. 4 and 5 again, the rotation angle of the transmission lens is +X° (based on X axis), −X° (based on X axis), +Y° (based on Y axis) and −Y° (based on Y axis). In some embodiments, X° is not more than 15°, Y° is not more than 15°. In a three-dimensional space, the rotation angle of the transmission lens is (−X°, +Y°), (+X°, +Y°), (+X°, −Y°), and (−X°, −Y°).

The micro display module disclosed herein further includes an actuator controller electrically connected with the lens position rotating actuator for controlling the rotation direction and rotating frequency of the lens position rotating actuator, so that the transmission lens can be rotated at various angle based on X axis and/or Y axis, and the emitting light of each of the pixel can be shifted at various positions to increase the resolution ratio of the pixels.

Figure 6:
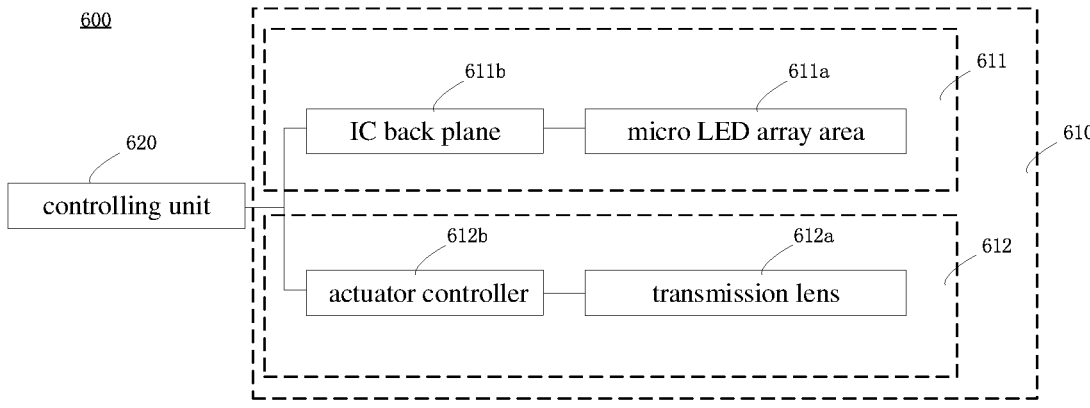
FIG. 6 is a schematic block of a micro display system, according to some embodiments of the present disclosure.

FIG. 6 is a schematic block of a micro display system, according to some embodiments of the present disclosure. Referring to FIG. 6, the micro display module can be applied in a micro display system 600. The micro display system 600 includes the aforementioned display module 610 and a controlling unit 620. The controlling unit 620 is connected with the micro LED display device 611 and the image light rotating element 612. The micro LED display device 611 includes a micro LED array area 611*a* and an IC (integrated circuit) back plane 611*b* that is formed such as metal-bonded at the bottom of the micro LED array area 611*a* and electrically connected with each of the micro LEDs. Furthermore, the controlling unit 620 is connected with the IC back plane 611*b* and the actuator controller 612*b* for transmitting signals to the IC back plane 611*b* and the actuator controller 612*b*. The controlling unit 620 is configured to process the objective image data to form N pieces of sub-image data and calculates the rotation direction and rotating frequency of the transmission lens 612*a* for each sub-image data according to a refresh frequency of the objective image data, send the rotation direction and rotating frequency to the actuator controller 612*b*, and send the sub-image data and the rotating frequency to the IC back plane 611*b*. The actuator controller 612*b* is configured to receive the rotation direction and the rotating frequency of the transmission lens 612*a* for each sub-image data. The actuator controller 612*b* is further configured to control the lens position rotating actuator (not shown) and the transmission lens 612*a* to perform rotating process based on the rotation direction and the rotating frequency for each sub-image data. The IC back plane 611*b* is configured to synchronously control the micro LED display device 611 to display sub-image according to the sub-image data and the rotating frequency.

The sub-image of sub-image data, the shifting position of the sub-image, and relationship of the rotation of the transmission lens and the shifting position of the sub-images are further disclosed in details as follows.

Each of the pixel point in the micro LED array area is separately formed in a corresponding pixel area; each of the pixel area comprises N pieces of pixel sub-images; wherein, the pixel sub-images of a pixel point is shifted in a shifting order and in the pixel area of the pixel point; the N-pieces sub-images are shifted in a same shifting order with the pixel sub-images, wherein N is an integer and not less than two. The rotating frequency of sub-image data is M times of the refresh frequency of the objective image data, wherein M is an integer and not less than two. In some embodiments, M is equal to N. In some embodiments, M is an even integer. In some embodiments, the shifting direction is a clock wise direction. The refresh frequency of the objective image data is 50-70 Hz. In some embodiments, M can be less than 1, for example, 0.5.

Figure 7:
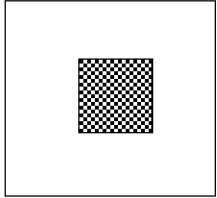
FIG. 7 illustrates a pixel area of the micro LED array, according to some embodiments of the present disclosure.
Figure 8:
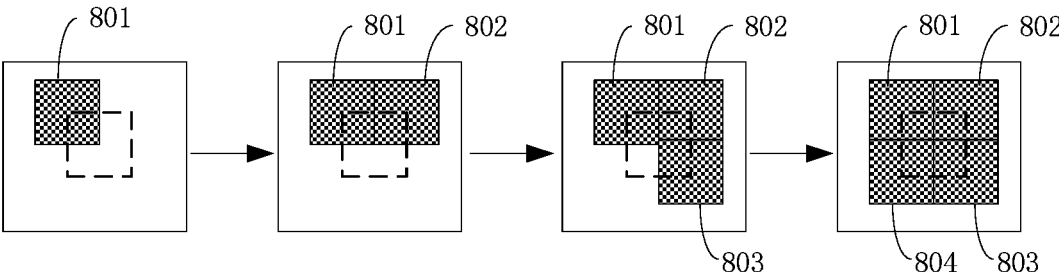
FIG. 8 illustrates positions of the pixel sub-images shifting from the objective pixel point in the pixel area, according to some embodiments of the present disclosure.

FIG. 7 illustrates a pixel area of the micro LED array according to some embodiments of the present disclosure. Referring to FIG. 7, which illustrates one initial pixel image without the rotation of the transmission lens, the big block is a pixel area and the small block is the pixel point of the pixel area. FIG. 8 illustrates positions of the pixel sub-images shifting from the objective pixel point in the pixel area, according to some embodiments of the present disclosure. Referring to FIG. 8, which illustrates the pixel sub-images with the rotating of the transmission lens according to some embodiments, the dotted small block represents the initial pixel point without being shifted in the objective image. The pixel area includes a first pixel sub-image 801 of the pixel point, a second pixel sub-image 802 of the pixel point, a third pixel sub-image 803 of the pixel point, and a fourth pixel sub-image 804 of the pixel point. The first pixel sub-image 801 is shifted left-up in the pixel area compared with the pixel point (the dotted block) in the objective image. The second pixel sub-image 802 is shifted right-up in the pixel area compared with the pixel point in the objective image. The third pixel sub-image 803 is shifted right-down in the pixel area compared with the pixel point in the objective image. And the fourth pixel sub-image 804 is shifted left-down in the pixel area compared with the pixel point in the objective image.

As disclosed herein, the rotating frequency of the transmission lens is four times of the refresh frequency of the objective image data. The rotation angle of the transmission lens is (−X°, +Y°), (+X°, +Y°), (+X°, −Y°), (−X°, −Y°) in order, so the sub-images corresponding to each of the rotation angles are displayed from left to right and from up to down in a clock-wise direction.

Figure 9:
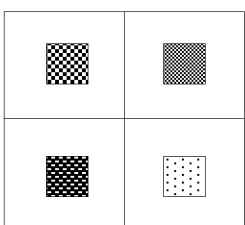
FIG. 9 illustrates an objective image formed by the objective image data, according to some embodiments of the present disclosure.
Figure 10:
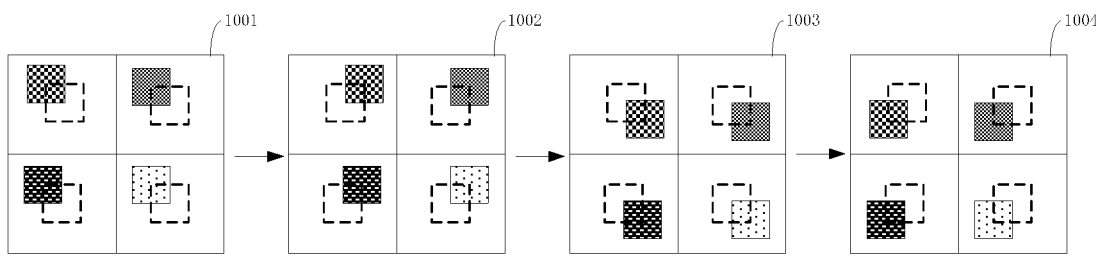
FIG. 10 illustrates position of each of the sub-images shifting from the objective image, according to some embodiments of the present disclosure.

FIG. 9 illustrates an objective image formed by the objective image data, according to some embodiments of the present disclosure. Referring to FIG. 9, an objective image of an example is formed by different gray scale of a micro LED array. The micro LED array of the micro LED display device are M×N matrix, where M is more than 2, N is more than 2. For example, the micro LED array is 1280×680. In FIG. 9, the four pixel points are four micro LEDs, which only exemplify the micro LED array for describing the objective image and sub-images, and are not used to limit the scope of the present disclosure. FIG. 10 illustrates position of each of the sub-images shifting from the objective image, according to some embodiments of the present disclosure. Referring to FIG. 10, the objective image data is processed to form four sub-image data: a first sub-image 1001, a second sub-image 1002, a third sub-image 1003, and a fourth sub-image 1004. As shown in FIG. 10, the dotted blocks represent the pixel point of the objective image in each of the pictures. The sub-images formed by the sub-image data are separately shown in FIG. 10.

Referring to FIG. 8 and FIG. 10, each of the pixel areas includes a first pixel image 801, a second pixel image 802, a third pixel image 803, and a fourth pixel image 804. The first pixel image 801 is shifted left-up in the pixel area compared with the pixel point in the objective image; the second pixel image 802 is shifted right-up in the pixel area compared with the pixel point in the objective image; the third pixel image 803 is shifted right-down in the pixel area compared with the pixel point in the objective image; and the fourth pixel image 804 is shifted left-down in the pixel area compared with the pixel point in the objective image. Therefore, the first sub-image 1001 is shifted left-up in the objective image area compared with the objective image; the second sub-image 1002 is shifted right-up in the objective image area compared with the objective image; the third sub-image 1003 is shifted right-down in the objective image area compared with the objective image; and the fourth sub-image 1004 is shifted left-down in the objective image area compared with the objective image. The objective image area is as same as the micro LED array area and not changed in the displaying process.

In FIG. 10, the positions of the sub-images are shifted from left to right and from up to down in a clock-wise direction with the rotating of the transmission lens at the rotating angles of (−X°, +Y°), (+X°, +Y°), (+X°, −Y°), (−X°, −Y°) in order. That is to say, the position of the sub-image is shifted by rotating the transmission lens; and the position of the sub-image is decided by the rotating angle of the transmission lens. As disclosed herein, the sub-images formed by the sub-image data are as same as the objective image formed by the objective image data, thereby ensuring the quality of the displayed objective image. Furthermore, the gray-scale of all of the pixel sub-images of the same pixel point is as same as the gray-scale of the objective pixel image of the same pixel point in the objective image data, as shown in FIG. 10. In another example, the gray-scale of at least one of the pixel sub-images of the same pixel point is not as same as the gray-scale of the objective pixel image of the same pixel point in the objective image data. As disclosed herein, in this embodiment, one pixel is made by one micro LED.

Figure 11:
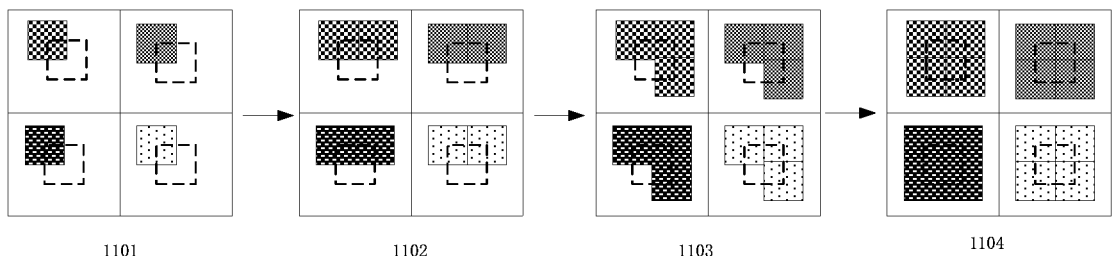
FIG. 11 illustrates the positions of the sub-images shifting from the objective image, according to some embodiments of the present disclosure.

The controlling unit is configured to send the four sub-image data and the rotating frequency to the IC back plane and send the rotation angles and the rotating frequency to the actuator controller. FIG. 11 illustrates the positions of the sub-images shifting from the objective image, according to some embodiments of the present disclosure. Referring to FIG. 11, the dotted blocks represent the pixel point of the objective image. The actuator controller controls the transmission lens rotating at the rotating angles of (−X°, +Y°) based on the rotating frequency, such as 240 Hz, and the IC back plane controls the micro LED display device displaying the first sub-image based on the rotating frequency as shown in a first picture 1101. The actuator controller controls the transmission lens rotating at the rotating angles (+X°, +Y°) based on the rotating frequency, and the IC back plane controls the micro LED display device displaying the second sub-image based on the rotating frequency as shown in the second picture 1102. Similarly displaying of the third sub-image is shown in the third picture 1103 and similarly displaying of the fourth sub-image is shown in the fourth picture 1104. Because the rotating frequency is very fast, human eyes cannot see transmitting of the four sub-images and only see a final objective image as shown in the fourth picture 1104 in FIG. 11, which is similar to the picture shown in FIG. 9. The four sub-images are combined together in the clock-wise direction to form the final objective image shown in the fourth picture 1104.

Figure 12:
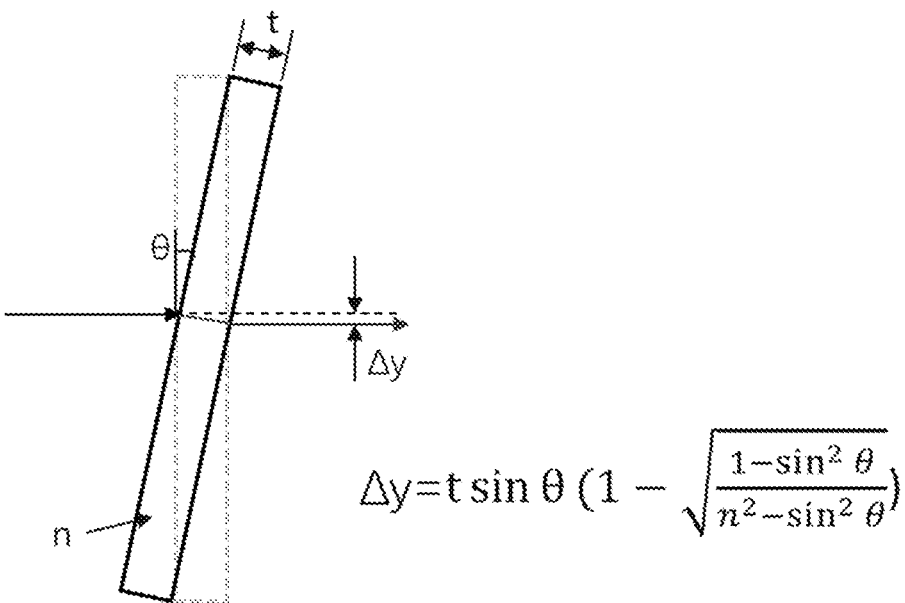
FIG. 12 is a formula relationship between the shifting distance of the sub-image from the objective image and the rotation angle of the transmission lens based on a certain axis, according to some embodiments of the present disclosure.

FIG. 12 is a formula relationship between the shifting distance of the sub-image from the objective image and the rotation angle of the transmission lens based on a certain axis, according to some embodiments of the present disclosure. Referring to FIG. 12, the relationship of the shifting distance and the rotation angle is as follows:

$$\Delta y = t \sin\theta \left(1 - \sqrt{\frac{1 - \sin^2\theta}{n^2 - \sin^2\theta}}\right)$$

wherein Δy is the shifting distance, θ is the rotation angle, t is the center thickness of the transmission lens, n is the refraction ratio of the transmission lens. As disclosed herein, the shifting distance between the adjacent sub-images is, for example, 50~100% of the pixel pitch. Therefore, the rotation angle can be calculated by the above formula.

Figure 13:
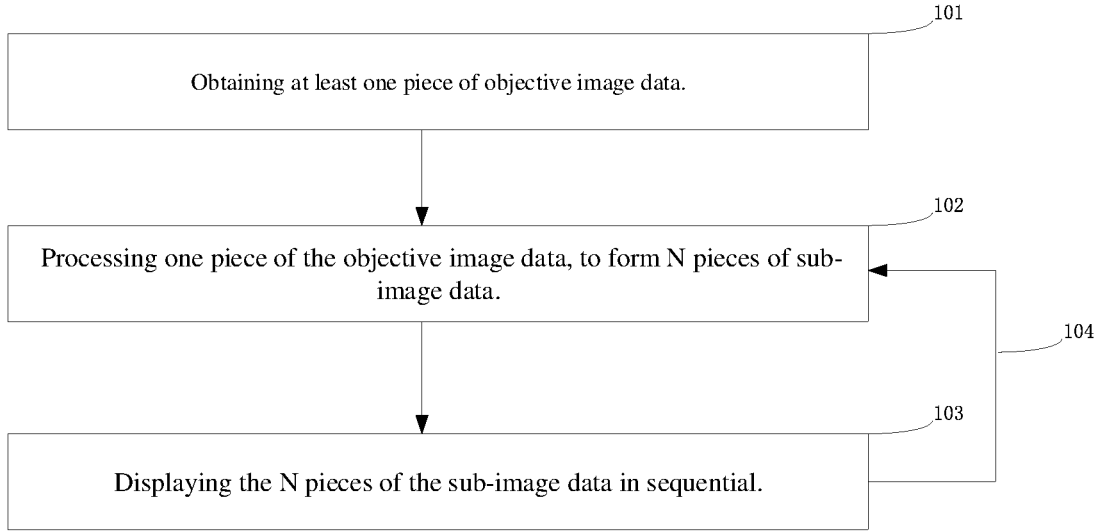
FIG. 13 is a flow chart illustrating the micro image displaying method, according to some embodiments of the present disclosure.

FIG. 13 is a flow chart illustrating the micro image displaying method, according to some embodiments of the present disclosure. Referring to FIG. 13, the micro image displaying method according to the aforementioned micro display system of the embodiment includes the following steps 101 to 104.

At step 101, at least one piece of objective image data is obtained. The objective image data is transmitted from outside into the controlling unit.

At step 102, one piece of the objective image data is processed to form N pieces of sub-image data, wherein N is not less than two. For example, four sub-image data is formed. The four sub-image data is the same, and the four sub-images formed by the sub-image data are the same, as shown in FIG. 9.

At step 103, the N pieces of the sub-image data are displayed in sequential to form N pieces of sub-images based on the rotating frequency and the preset rotation direction of the transmission lens for each sub-image data, wherein N is an integer and not less than two. Furthermore, the pixel sub-images of a pixel point are shifted in a shifting order and in the pixel area of the pixel point; the N-pieces sub-images are shifted in a same shifting order with the pixel sub-images. The rotating frequency of sub-image data is M times of the refresh frequency of the objective image data. In some embodiments, N is an integer and not less than two and M is an integer not less than two. In some embodiments, M is equal to N. In some embodiments, M is an even integer. For example, the rotating frequency of the transmission lens is four times of the refresh frequency of the objective image data. The refresh frequency of the objective image data is, for example, 50~70 Hz. As disclosed herein, the shifting direction is a clock wise direction. The sub-images formed by the sub-image data are as same as the objective image formed by the objective image data.

Furthermore, the actuator controller is configured to control the transmission lens rotating at the rotating angles of (−X°, +Y°) based on the rotating frequency, such as 240 Hz, and the IC back plane is configured to control the micro LED display device displaying the first sub-image 1001 based on the rotating frequency as shown FIG. 10. The actuator controller is configured to control the transmission lens rotating at the rotating angles (+X°, +Y°) based on the rotating frequency and the IC back plane is configured to control the micro LED display device displaying the second sub-image 1002 based on the rotating frequency as shown in FIG. Similarly displaying of the third sub-image 1003 and similarly displaying of the fourth sub-image 1004 are also shown in FIG. 10.

As shown in FIG. 10, the first sub-image 1001 is shifted left-up in the objective image area (the big solid line block in FIG. 10) compared with the objective image; the second sub-image 1002 is shifted right-up in the objective image area compared with the objective image; the third sub-image 1003 is shifted right-down in the objective image area compared with the objective image; and the fourth sub-image 1004 is shifted left-down in the objective image area. The objective image area is as the same as the micro LED array area and not changed in the displaying process.

Furthermore, referring back to FIG. 8, each of the pixel areas includes a first pixel image 801, a second pixel image 802, a third pixel image 803, and a fourth pixel image 804. The first pixel image 801 is shifted left-up in the pixel area (the big solid line block in FIG. 8) compared with the pixel point in the objective image; the second pixel image 802 is shifted right-up in the pixel area compared with the pixel point in the objective image; the third pixel image 803 is shifted right-down in the pixel area compared with the pixel point in the objective image; and the fourth pixel image 804 is shifted left-down in the pixel area compared with the pixel point in the objective image.

Because the rotating frequency is very fast, human eyes cannot see transmitting of the four sub-images and only see the final objective image as shown in the fourth picture in FIG. 11. The four sub-images are combined together in the clock-wise direction to form the final objective image.

The gray-scale of all of the pixel sub-images of the same pixel point is as same as the gray-scale of the objective pixel image of the same pixel point in the objective image data, as shown in FIG. 10. In another example, the gray-scale of at least one of the pixel sub-images of the same pixel point is not as same as the gray-scale of the objective pixel image of the same pixel point in the objective image data. As disclosed herein, in this embodiment, one pixel is made by one micro LED.

At step 104, recycling the steps 102 to 103 until all of the objective image data displayed.

As disclosed herein, for example, a plurality of objective images can be displayed by recycling the steps 101 to 103.

Another micro image displaying method according to the aforementioned micro display system, includes the following steps 201 to 204.

At step 201, at least one piece of objective image data is obtained.

At step 202, each of the objective image data is processed to form N pieces of sub-image data for each of the objective image data.

At step 203, the sub-image data of the first objective image data is displayed in sequential to form N pieces of sub-images based on the rotating frequency and the preset rotation direction of the transmission lens for each sub-image data; wherein N is an integer and not less than two.

At step 204, the steps 202 to 203 are recycled until all of the objective image data displayed.

The details of steps 201 to 204 can be referred to the steps 101 to 104, which will not be repeated herein.

Figure 14:
FIG. 14 illustrates a structural diagram showing a side sectional view of an exemplary micro LED display device, according to some embodiments of the present disclosure.

FIG. 14 illustrates a structural diagram showing a side sectional view of an exemplary micro LED display device 100, according to some embodiments of the present disclosure. As shown in FIG. 14, the micro LED display device 100 includes the micro LED panel 130, a top cover plane 140, and a seal structure 150. The micro LED panel 130 includes a micro LED array area 132 and an IC (integrated circuit) substrate 131. The micro LED array area 132 is located on the IC substrate 131 to form an image display area of the micro LED panel 130. The rest of the area on the IC substrate 131 not covered by the micro LED array area 132 is formed as a non-functional area. The top cover plane 140 is provided above the micro LED panel 130 and supported by the seal structure 150. The top cover plane 140 covers the image display area (e.g., the micro LED array area 132) and at least part of the non-function area. Therefore, the light emitted from the image display area transmits upward to the top cover plane 140. The seal structure 150 is formed between an edge of the micro LED panel 130 and an edge of the top cover plane 140. It can be understood that the seal structure 150 forms a closed area on the micro LED panel 130 (more specifically, on the IC substrate 131), and surrounds the image display area (e.g., the micro LED array area 132). In some embodiments, an outer sidewall of the seal structure 150 is aligned with a sidewall of the top cover plane 140 in a vertical direction. In some embodiments, the micro LED panel 130 is a self-emitting micro LED display panel.

With this micro LED display device 100, the seal structure 150 can prevent light emitting from the image display area to outside through a gap between the top cover plane 140 and the micro LED panel 130.

In some embodiments, a distance between the top cover plane 140 and the micro LED panel 130 (e.g., a distance between a bottom surface of the top cover plane 140 and a top surface of the micro LED array area 132) is not greater than a thickness of the micro LED panel 130. For example, the thickness of the micro LED panel 130 is 500 µm to 5 mm. In some embodiments, the distance between the top cover plane 140 and the micro LED panel 130 (e.g., a distance between a bottom surface of the top cover plane 140 and a top surface of the micro LED array area 132) is not greater than a thickness of the top cover plane 140. For example, the thickness of the top cover plane 140 is not greater than 1500 µm. More specifically, the thickness of the top cover plane 140 is in a range of 200 µm to 1500 µm. In some embodiments, the distance between the top cover plane 140 and the micro LED panel 130 is as same the thickness of the top cover plane 140. For example, the distance between the top cover plane 140 and the micro LED panel 130 is in a range of 200 µm to 1500 µm. In some embodiments, a distance between the top cover plane 140 and the micro LED panel 130 is in a range of 3 µm to 5 µm. In some embodiments, the top cover plane 140 is transparent. For example, the material of top cover plane 140 can be organic glass or inorganic glass.

In some embodiments, the seal structure 150 is formed on the non-function area of the micro LED panel 130. That is, the seal structure 150 connects the IC substrate 131 and the top cover plane 140. A height of the seal structure can be equal to the distance between the top cover plane 140 and the non-functional area (e.g., a top of the IC substrate 131). In some embodiments, the seal structure 150 can include light absorption material, such as a combination of film forming agent composed of resin and polymer and light sensitive sensitizer. The light absorption material can include a film forming agent. The film forming agent can include one or more of resin, polymer, light-sensitive sensitizer, or a combination thereof. With the light absorption material, the seal structure 150 can further absorb the light emitted from the image display area, so as to improve the image quality.

In some embodiments, the seal structure 150 can include sealant 151 and a plurality of spacers 152. The seal structure 150 can be a combination of the sealant 151 and the plurality of spacers 152. The material of the sealant 151 can comprise one or more of a resin and a polymer. For example, the resin can be an epoxy resin, and the polymer can be silicone. The spacers 152 can be small balls with a same diameter. Since the sealant 151 is flowable, the top cover plane 140 can be pressed downwards as close as possible to the micro LED panel 130. Therefore, a diameter of the ball can define a height of the seal structure 150, in another word, the distance between the top cover plane 140 and the non-functional area (e.g., a top of the IC substrate 131). Using such seal structure 150, the distance between the top cover plane 140 and the micro LED panel 130 can be efficiently guaranteed or adjusted according to the thickness of the spacers 152 (e.g., the diameter of the balls).

In some embodiments, the micro LED display device 100 can further include a support base plane formed under the bottom of micro LED panel 130. The support base plane is rigid, so as to provide a stable base of the micro LED panel 130.

Figure 15:
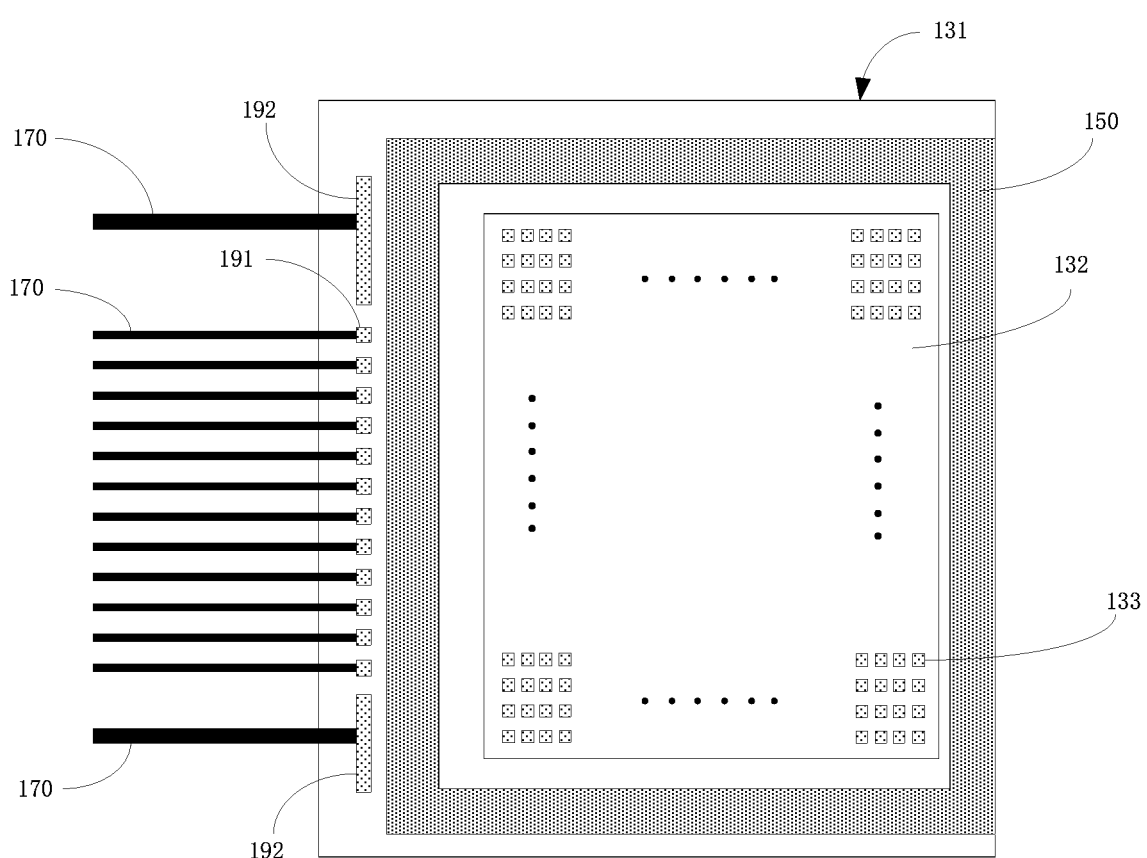
FIG. 15 illustrates a structural diagram showing a top view of the micro LED display device shown in FIG. 14, according to some embodiments of the present disclosure.
Figure 16:
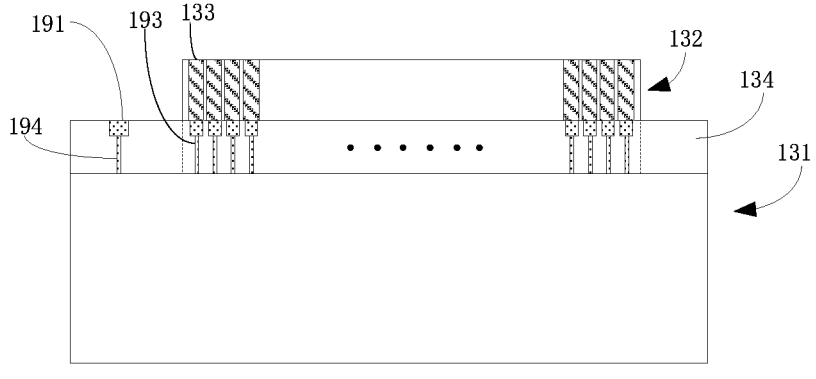
FIG. 16 illustrates a structural diagram showing a side sectional view of a micro LED panel shown in FIG. 14, according to some embodiments of the present disclosure.

FIG. 15 illustrates a structural diagram showing a top view of the micro LED display device shown in FIG. 14, according to some embodiments of the present disclosure. FIG. 16 illustrates a structural diagram showing a side sectional view of the micro LED panel shown in FIG. 14, according to some embodiments of the present disclosure. Referring to FIG. and FIG. 16, the micro LED panel 130 further includes a micro LED array area 132 and an IC substrate 131 which is formed at the bottom of the micro LED array area 132 with an extruded part extending outside of the micro LED array area 132. The micro LED array area 132 forms the image display area, and the extruded part of the IC substrate 131 forms the non-functional area. The micro LED array area 132 further includes a plurality of micro LEDs 133 which are provided in an array. A plurality of signal metal pads and dummy metal can be further formed on a surface of the non-functional area. The signal metal pads can include a plurality of IO (input/output) metal pads 191 and a plurality of dummy metal pads 192.

The IO metal pads 191 can conductively connect to the IC substrate 131. The micro LEDs 133 in the micro LED array area 132 are connected with the IC substrate 131 by a plurality of first metal connected holes 193, respectively. That is, every micro LED 133 is connected with the IC substrate 131 by one first metal connected hole 193. Respective tops of the first metal connected holes 193 are connected with the micro LEDs 133 one-to-one. Accordingly, the plurality of first metal connected holes 193 correspond to the plurality of micro LED 133. As shown in FIG. 15, the first metal connected holes 193 are formed in an array which is the same as the micro LED array, and the first metal connected holes 193 are formed as a first connected area on the IC substrate 131, which corresponds to the micro LED array area (e.g., the image display area). Bottom of the signal metal pads, i.e., the IO metal pads 191 and the dummy metal pads 192, are connected with the IC substrate 131 by a plurality of second metal connected holes 194. Bottoms of the second metal connected holes 194 of the IO metal pads 191 are conductively connected with bottoms of the first metal connected holes 193. Therefore, the IO metal pads 191 can conductively connect with the micro LEDs 133 through the second metal connected holes 194, the IC substrate 131, and the first metal connected holes 193. The bottoms of the second metal connected holes 194 of the dummy metal pads 192 are conductively connected with the top electrodes of the micro LEDs 133. The second metal connected holes 194 are formed as a second connected area on the non-functional area. The second connected area is away from the first connected area, and closed to the edge of the IC substrate 131. In some embodiments, the first connected area refers as to an inside connected area, and the second connected area refers as to an external connected area. The first metal connected holes 193 and the second metal connected holes 194 are formed in a top layer 134 of the IC substrate 131. It is noted that, the IC substrate 131 can further include a conventional metal interconnected multilayer to connect the IO metal pads 191 for each micro LED 133. The metal interconnected multilayer can be understood by those skilled in the art, which will not be described herein.

Referring to FIG. 14 and FIG. 15, since the seal structure 150 is formed on the non-functional area, the first connected area and the second connected area are further separated by the seal structure 150. For example, the second connected area is formed between the seal structure 150 and the edge of the IC substrate 131. The second connected area is not covered by the seal structure 150. As shown in FIG. 15, the IO metal pads 191 are formed on the second connected area in a one-dimensional array (e.g., in a line). At least some of the dummy metal pads 192 are formed on the second connected area, which are arranged in a one-dimensional array. In some embodiment, all of the dummy metal pads 192 and the IO metal pads 191 are formed on the second connected area.

Referring to FIG. 14 and FIG. 15, the micro LED display device 100 further includes bonding wires 170. The bonding wires 170 connect the signal metal pads such as the IO metal pads 191 and the dummy metal pads 192 on the second connected area with an external circuit. Therefore, the IC substrate 131 and the micro LEDs 133 in the micro LED array area 132 can be conductively connected with the external circuit by the bonding wires 170. Since only the signal metal pads on the second connected are used to connect with the external circuit, interference of the IO metal pads 191 can be decreased and external design can be facilitated.

Referring back to FIG. 14, in some embodiments, the micro LED display device 100 further includes a protective layer 180. The protective layer 180 is formed on a surface of the second connected area and covers around a surface of the bonding wires 170, so as to protect the connection between the second connected area and the external circuit. The bonding wires 170 can be also be protected by the protective layer 180. In some embodiments, a top of the protective layer 180 is lower than a top of the top cover plane 140. Therefore, the protective layer 180 cannot contact the top cover plane 140. Furthermore, the top of the protective layer 180 is lower than a top of the micro LED array area 132. The material of the protective layer 180 can include resin and polymer. For example, the resin is epoxy resin, and the polymer is silicone. In some embodiments, a sidewall of the protective layer 180 connects to a sidewall of the seal structure 150. Therefore, the protective layer 180 and the seal structure 150 are connected, and there is no non-functional area exposed between the protective layer 180 and the seal structure 150.

In some embodiments, the micro LED display device 100 further includes an external circuit plane 120. The external circuit is formed on the external circuit plane 120. The external circuit plane 120 is formed at the bottom of the micro LED panel 130 with an extruded part extending outside of the micro LED panel 130. The protective layer 180 is further formed on the surface of the extruded part of the external circuit plane 120. In some embodiments, a support base plane 110 is further formed under the bottom of the external circuit plane 120. The support base plane 110 is rigid, so as to provide a stable base of the micro LED panel 130 and the external circuit plane 120.

In some embodiments, the external circuit plane 120 is formed outside of the bottom of the micro LED panel 130, surrounding the micro LED panel 130. That is, the external circuit plane 120 and the micro LED panel 130 are integrated in a same plane. Therefore, the micro LED display device 100 can be more compact. The protective layer 180 is further formed on the part of the external circuit plane 120. In this example, the support base plane 110 can be formed under the external circuit plane 120 and the micro LED panel 130.

Figure 17:
FIG. 17 illustrates a structural diagram showing a side sectional view of another exemplary micro LED display device, according to some embodiments of the present disclosure.
Figure 18:
FIG. 18 illustrates a structural diagram showing a top view of the micro LED display device shown in FIG. 17, according to some embodiments of the present disclosure.
Figure 19:
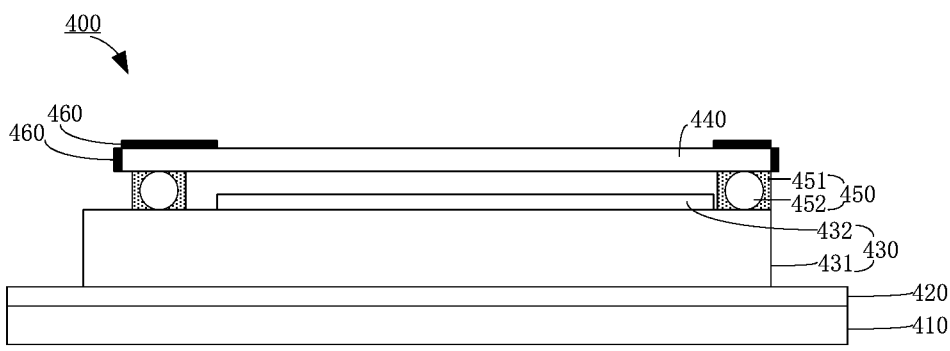
FIG. 19 illustrates a structural diagram showing a side sectional view of a variation of the exemplary micro LED display device shown in FIG. 17, according to some embodiments of the present disclosure.
Figure 20:
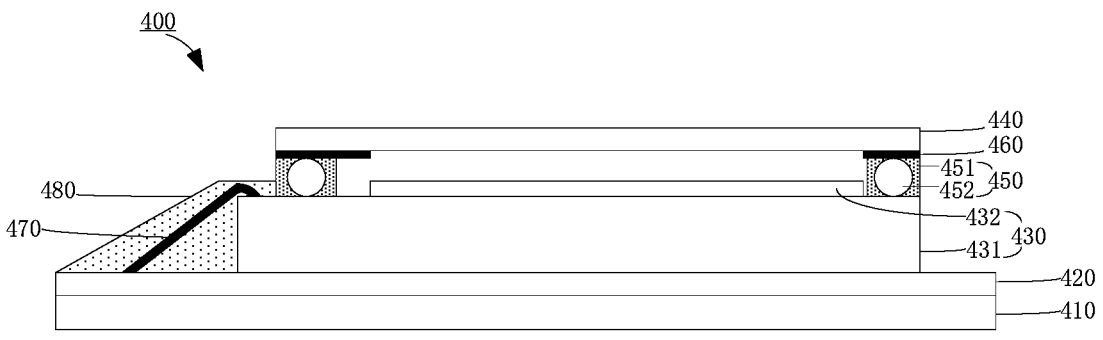
FIG. 20 illustrates a structural diagram showing a side sectional view of another variation of the exemplary micro LED display device shown in FIG. 17, according to some embodiments of the present disclosure.

FIG. 17 to FIG. 21 illustrate structural diagrams showing variations of another exemplary micro LED display device, according to some embodiments of the present disclosure. Referring to FIG. 17 to FIG. 21, a micro LED display device 400 includes a micro LED panel 430, a top cover plane 440, and a light shielding layer 460. The micro LED panel 430 includes a micro LED array area 432 and an IC substrate 431. The micro LED array area 432 is located on the IC substrate 431 to form an image display area of the micro LED panel 430. The rest of the area on the IC substrate 431 not covered by the micro LED array area 432 is formed as a non-functional area. The top cover plane 440 is formed above the micro LED panel 430. Light emitted from the image display area transmits upward to the top cover plane 440. The light shielding layer 460 is formed on an edge surface of the top cover plane 440. It can be understood that the light shielding layer 460 extends along the perimeter of the top cover plane 440. The light shielding layer 460 can be formed on a top edge surface of the top cover plane 440 (as shown in FIG. 17) or on a bottom edge surface of the top cover plan 440 (as shown in FIG. 20). A projection of the light shielding layer 460 in a vertical direction on the micro LED panel 430 covers at least part of the non-functional area. FIG. 18 illustrates a structural diagram showing a top view of the micro LED display device 400 of the micro LED panel shown in FIG. 17 or FIG. 19, according to some embodiments of the present disclosure. As shown in FIG. 18, viewed from the top, the light shielding layer 460 forms around the top cover plane 440, and covers at least part of the non-function area, exposing the image display area. A shape of the light shielding layer 460 is a closed geometric structure at least exposing the image display area, such as a rectangular frame, a circular frame, an elliptical frame, or any other geometric shape. The shape of the light shielding layer 460 shown in FIG. 18 is a rectangular with an opening at least exposing the image display area. In some embodiments, since the image display area (e.g., the micro LED array area 432) may not be located at a center of the micro LED panel 430, a center of the opening (e.g., a center of the display area or a center of the micro LED array area 432) is not aligned with a center of the top cover plane 440.

Therefore, light emitted from the image display area transmitting to the top cover plane 440 where the light shielding layer 460 is formed cannot be reflected back to the micro LED panel 430, so as to improve the image quality.

In some embodiments, the projection area of the light shielding layer 460 on the non-functional area covers the IO metal pads and the dummy metal pads. Therefore, there is no light reflected back on the IO metal pads and the dummy metal pads, or further reflected by the IO metal pads and the dummy metal pads outwards from the micro LED panel 430. In some embodiments, the projection area of the light shielding layer 460 on the non-functional area further covers the dummy metal that is formed on the non-functional area, so as to prevent the reflection by the dummy metal.

In some embodiments, an outside edge of the light shielding layer 460 is aligned with the sidewall of the top cover plane 440 in a vertical direction. That means the light shielding layer 460 extends to the furthest edge of the top cover plane 440. In some embodiments, an inside edge of the light shielding layer 460 is aligned with a sidewall of the image display area in the vertical direction. Therefore, the projection area of the light shielding layer 460 on the micro LED panel 430 covers the non-functional area as much as possible. Furthermore, the projection area of the light shielding layer 460 on the micro LED panel 430 covers the whole non-functional area.

In some embodiments, the light shielding layer 460 is an anti-reflection coating layer. Specifically, the material of the light shielding layer is black photo resist. The thickness of the light shielding layer 460 is not greater than half of the thickness of the top cover plane 440. For example, the thickness of the light shielding layer 460 is in a range of 0.3 μm to 5 μm. The light shielding layer 460 can be a spinning coat on the top cover plane 440. That is, the light shielding layer 460 is spun coated on the top cover plane 440.

In some embodiments, as shown in FIG. 17, the light shielding layer 460 is formed on a top edge surface of the top cover plane 440. Since the top cover plane 440 is transparent, the light shielding layer 460 on the top edge surface can also prevent reflecting of the transmitted light. FIG. 19 illustrates a structural diagram showing a side sectional view of another variation of the exemplary micro LED display device 400, according to some embodiments of the present disclosure. As shown in FIG. 19, the light shielding layer 460 is further formed on the sidewall of the top cover plane 440 so as to further prevent the light emitted from the image display area from reflecting by the sidewall of the top cover plane 440. The image quality is thereby further improved.

As shown in FIG. 17 and FIG. 19, the micro LED display device 400 can further includes a seal structure 450. The seal structure 450 is formed between the top surface of the non-functional area and a bottom surface of the top cover plane 440, thereby a closed space is formed between the micro LED panel 430 and the top cover plane 440 around the image display area. In some embodiments, a distance between the micro LED panel 430 and the top cover plane 440 is not greater than a thickness of the micro LED panel 430 or a thickness of the top cover plane 440. A height of the seal structure 450 is equal to a distance between the non-functional area (e.g., a top of the IC substrate 431) and the top cover plane 440 because of a thickness of the light shielding layer 460.

Figure 21:
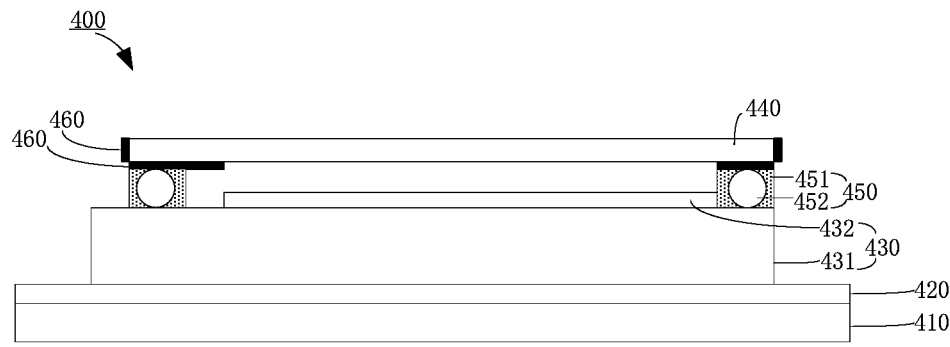
FIG. 21 illustrates a structural diagram showing a side sectional view of another a variation of the exemplary micro LED display device shown in FIG. 17, according to some embodiments of the present disclosure.

FIG. 20 illustrates a structural diagram showing a side sectional view of another variation of the exemplary micro LED display device 400 of a micro LED panel, according to some embodiments of the present disclosure. As shown in FIG. 20, the light shielding layer 460 is formed on a bottom edge surface of the top cover plane 440. A projection of the light shielding layer 460 in a vertical direction covers at least part of the non-functional area. FIG. 21 illustrates a structural diagram showing a side sectional view of another variation of the exemplary micro LED display device 400, according to some embodiments of the present disclosure. As shown in FIG. 21, the light shielding layer 460 is formed on a bottom edge surface of the top cover plane 440, and further formed on a sidewall of the top cover panel 440.

As shown in FIG. 20 and FIG. 21, the micro LED display device 400 can further includes the seal structure 450. The seal structure 450 is formed between the top surface of the non-functional area and a bottom surface of the light shielding layer 460 to form a closed space between the micro LED panel 430 and the top cover plane 440 around the image display area. In some embodiments, a distance between the micro LED panel 430 and the top cover plane 440 is not greater than a thickness of the micro LED panel 430 or a thickness of the top cover plane 440. A height of the seal structure 450 is less than the distance between the non-functional area (e.g., a top of the IC substrate 431) and the top cover plane 440 because of a thickness of the light shielding layer 460.

In some embodiments, an anti-reflection material can be integrated at the edge of the top cover plane to form a light shielding layer integrated with the top cover plane.

As shown in FIG. 17 to FIG. 21, the micro LED display device 400 can further include a support base plane 410, an external circuit panel 420, one or more bonding wires 470, and a protective layer 480. Further details regarding the support base plane 410, the external circuit panel 420, the seal structure 450, the bonding wires 470, the protective layer 480, and the signal metal pads can be found by referring to the description of the embodiment shown in FIG. 14, which will not be further described here.

Figure 22:
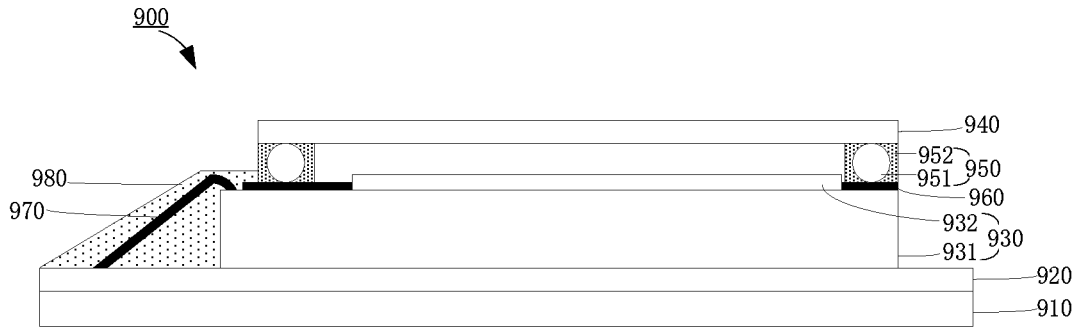
FIG. 22 illustrates a structural diagram showing a side sectional view of another exemplary micro LED display device, according to some embodiments of the present disclosure.
Figure 23:
FIG. 23 illustrates a structural diagram showing a top view of the micro LED display device shown in FIG. 22, according to some embodiments of the present disclosure.
Figure 24:
FIG. 24 illustrates a structural diagram showing a side sectional view of a variation of the exemplary micro LED display device shown in FIG. 22, according to some embodiments of the present disclosure.

FIG. 22 to FIG. 24 illustrate structural diagrams showing variations of another exemplary micro LED display device, according to some embodiments of the present disclosure. Referring to FIG. 22 to FIG. 24, a micro LED display device 900 includes a micro LED panel 930, a top cover plane 940, and a light shielding layer 960. The micro LED panel 930 includes a micro LED array area 932 and an IC substrate 931. The micro LED array area 932 is located on the IC substrate 931 to form an image display area of the micro LED panel 930. The rest of the area on the IC substrate 931 not covered by the micro LED array area 932 is formed as a non-functional area. The light shielding layer 960 is formed on at least part of the surface of the non-functional area. Therefore, the light emitted from the image display area and reflected by the top cover panel 940 to the non-functional area cannot be reflected again. In some embodiments, a top of the light shielding layer 960 is lower than a top of the micro LED panel 930 (e.g., a top of the micro LED array area 932).

In some embodiments, IO metal pads are further formed on the surface of the non-function area, and the light shielding layer 960 covers the IO metal pads. Therefore, the light reflected to the non-functional area cannot be reflected by the IO metal pads again, so as to improve the micro LED panel quality.

In some embodiments, a dummy metal is further formed on the surface of the non-functional area, and the light shielding layer 960 further covers the dummy metal. In some embodiments, the light shielding layer 960 covers the whole non-functional area.

In some embodiments, an outside edge of the light shielding layer 960 is aligned with a part of the sidewall of the micro LED panel 930 in a vertical direction. Furthermore, the outside edge of the light shielding layer 960 is aligned with a part of the non-functional area in a vertical direction. In some embodiments, the light shielding layer 960 covers the non-functional area except for one edge surface exposed for connecting the bonding wires 970. In some embodiments, an inside edge of the light shielding layer 960 is aligned with the sidewall of the image display area in a vertical direction. That is, the light shielding layer 960 contacts the micro LED array area 932. Therefore, the light shielding layer 960 covers the non-functional area as much as possible.

FIG. 23 illustrates a structural diagram showing a top view of the micro LED display device shown in FIG. 22, according to some embodiments of the present disclosure. As shown in FIG. 23, viewed from the top, the light shielding layer 960 is formed on the non-functional area of the IC substrate 931, exposing the image display area. A shape of the light shielding layer 960 is a closed geometric structure at least exposing the image display area, such as a rectangular frame, a circular frame, an elliptical frame, or any other geometric shape. The shape of the light shielding layer 960 shown in FIG. 23 is rectangular with an opening at least exposing the image display area.

In some embodiments, the light shielding layer 960 is an anti-reflection coating layer. Specifically, the material of the light shielding layer is black photo resist. The thickness of the light shielding layer 960 is not greater than half of the thickness of the top cover plane 940. For example, the thickness of the light shielding layer 960 is in a range of 0.3 μm to 5 μm.

In some embodiments, the micro LED display device 900 can further include a seal structure 950. The seal structure 950 is formed between the top surface of the light shielding layer 960 and a bottom surface of the edge of the top cover plane 940 around the image display area to form a closed space between the micro LED panel 930 and the top cover plane 940 around the image display area. In some embodiments, a distance between the micro LED panel 930 and the top cover plane 940 is not greater than a thickness of the micro LED panel 930 or a thickness of the top cover plane 940. A height of the seal structure 950 is less than the distance between the non-functional area (e.g., a top of the IC substrate 931) and the top cover plane 940 because of a thickness of the light shielding layer 960.

FIG. 24 illustrates a structural diagram showing a side sectional view of another variation of the exemplary micro LED display device 900, according to some embodiments of the present disclosure. As shown in FIG. 24, the light shielding layer 960 can be further formed on a sidewall of the top cover panel 940.

As shown in FIG. 22 to FIG. 24, the micro display device 900 can further include a support base plane 910, an external circuit panel 920, one or more bonding wires 970, and a protective layer 980. Further details regarding the support base plane 910, the external circuit panel 920, the seal structure 950, the bonding wires 970, the protective layer 980, and the signal metal pads can be found by referring to the description of the embodiment shown in FIG. 24, which will not be further described here.

Figure 25:
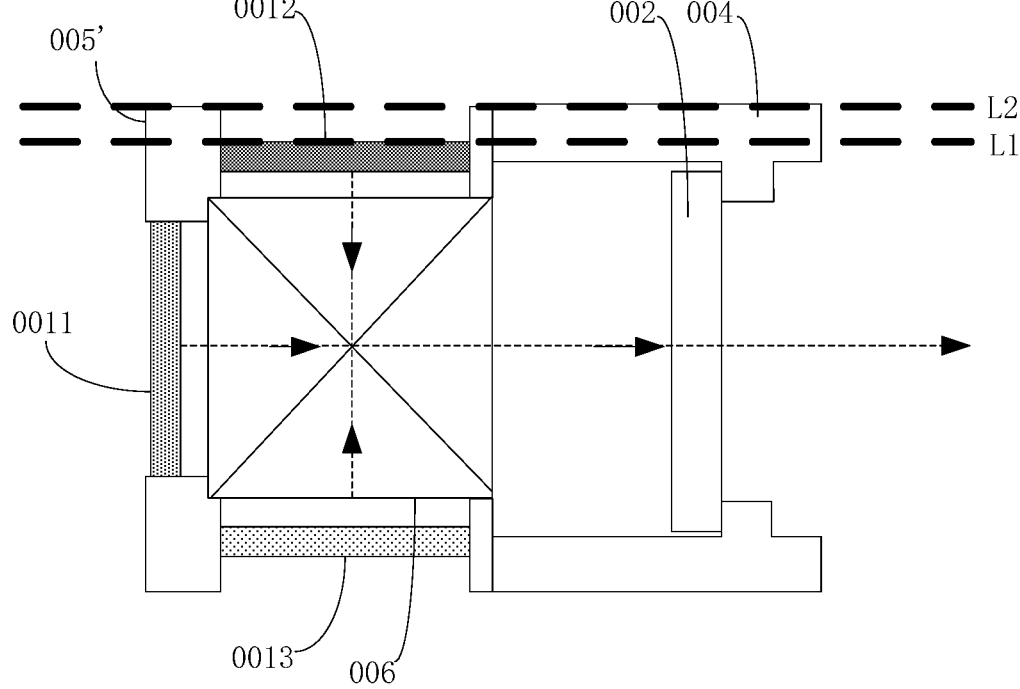
FIG. 25 is a cross sectional structure of another micro display module, according to some embodiments of the present disclosure.

FIG. 25 is a cross sectional structure of another micro display module, according to some embodiments of the present disclosure. Referring to FIG. 25, the micro LED display device includes three monochrome micro LED panel (e.g., a red micro LED panel, a blue micro LED panel, and a green micro LED panel) 0011, 0012, 0013, and an optical combination unit 006 combining three color images into one objective image. The three monochrome micro LED panels 0011, 0012, 0013, are arranged around the optical combination unit 006. A supporting frame 005' includes a center chamber and four openings that are around the center chamber. The optical combination unit 006 is arranged in the center chamber. The red micro LED panel 0011, the blue micro LED panel 0012, and the green micro LED panel 0013 are fixed on the edge of three openings respectively, and the other opening is left for transmitting image light outside. The other opening is arranged facing one of the three openings and facing one (e.g., 0011) of the three micro LED panels. The other opening is facing the transmission lens, so the image light emitted from the optical combination unit can transmit into the transmission lens (the arrow represents the transmitting direction of the image light). As disclosed herein, the optical combination unit 006 is an optical combination prism, such as X-cube. The back surface of the stiffening plate is not outside of the edge of the supporting frame 005'. As shown in FIG. 25, dotted line L1 represents the plane of the back surface of the micro LED panel 0012, dotted line L2 represents the plane of the edge of the supporting frame 005'.

Figure 26:
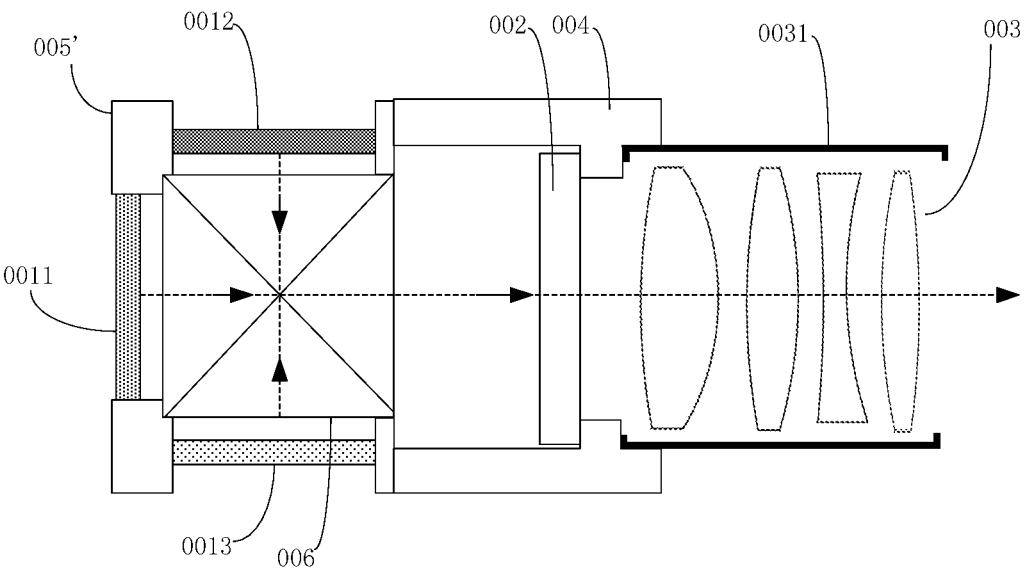
FIG. 26 is a cross sectional structure of another micro display projector, according to some embodiments of the present disclosure.

FIG. 26 is a cross sectional structure of another micro display projector, according to some embodiments of the present disclosure. Referring to FIG. 26, a micro display projector includes the aforementioned micro display module shown in FIG. 25 and a lens group. The lens group 003 is arranged facing the X-cube (optical combination unit 006)

for receiving the image light emitted from the micro LED panel 0011, 0012, and 0013. The diameter of at least one lens of the lens group 003 is not less than the diagonal line of the micro LED array area. The diameter of at least one lens of the lens group 003 can be less than the width of the X-cube. More details of the micro LED panels, the image light rotating element, and the lens group can be referred to the aforementioned description, which are not repeated here.

The embodiments may further be described using the following clauses:

1. A micro display module, comprising:

a micro LED display device comprising at least one micro LED (light emitting diode) panel, wherein the at least one micro LED panel comprises an IC back plane and a micro LED array area having one or more micro LEDs, the micro LED array area is formed on the surface of the IC back plane and each of the micro LEDs is electrically connected with the IC (integrated circuit) back plane; and an image light rotating element comprising a transmission lens arranged facing the micro LED array area and a lens position rotating actuator configured to rotate the transmission lens based on at least one preset axis, wherein the preset axis is parallel to the micro LED array area.

2. The micro display module according to clause 1, wherein the lens position rotating actuator is further configured to rotate the transmission lens based on an X axis, and the X axis is parallel to the micro LED array area in a first direction.

3. The micro display module according to clause 2, wherein the lens position rotating actuator is configured to rotate the transmission lens based on a Y axis, and the Y axis is parallel to the micro LED array area in a second direction; and the first direction is not parallel with the second direction.

4. The micro display module according to clause 3, wherein the X axis is perpendicular to the Y axis.

5. The micro display module according to clause 1, wherein the micro LED display device comprises:

three monochrome micro LED panels;

an optical combination unit combining three color images into one objective image, wherein the three monochrome micro LED panels are arranged around the optical combination unit; and a supporting frame comprising a center chamber and four openings that are around the center chamber; wherein the optical combination unit is arranged in the center chamber, each of the three micro LED panels is fixed on an edge of three openings respectively, a fourth opening is used for transmitting image light outside, the fourth opening is arranged facing one of the three openings.

6. The micro display module according to clause 1, wherein the micro LED display device further comprises: an external circuit plane formed at a bottom of the IC back plane and electrically connected with the IC back plane via a bonding wire.

7. The micro display module according to clause 6, wherein the external circuit plane is made by a flexible printed circuit.

8. The micro display module according to clause 6, wherein the IC back plane comprises a non-functional area and an inside connected area; the non-functional area is connected with the external circuit plane via the bonding wire; and the inside connected area is connected with the micro LEDs.

9. The micro display module according to clause 8, wherein the non-functional area is formed beside the inside connected area.

10. The micro display module according to clause 9, wherein the non-functional area is formed around the inside connected area.

11. The micro display module according to clause 8, wherein the inside connected area comprises a metal connected holes array that is formed in atop layer of the inside connected area; each of the metal connected holes is connected with each of the micro LEDs one by one; and a shape of the metal connected holes array is as the same as a shape of the micro LED array.

12. The micro display module according to clause 1, wherein the micro LED display device further comprises a top cover plane covering the micro LED panel.

13. The micro display module according to clause 12, wherein the top cover plane is a glass cover; and a gap is formed between the micro LED array area and the glass cover.

14. The micro display module according to clause 13, wherein a dimension of the micro LED is not more than five micro meters; and a diagonal line of the micro LED array area is not more than two inches.

15. The micro display module according to clause 1, wherein the transmission lens is an optical lens; and image light emitted from the micro LED array area passes through the transmission lens and is transmitted outside in a changeable direction corresponding to a rotating direction of the transmission lens.

16. The micro display module according to clause 15, wherein a diameter of the transmission lens is not less than a length of the micro LED array area.

17. The micro display module according to clause 15, wherein the micro display module further comprises an actuator controller, electrically connected with the lens position rotating actuator, configured to control a rotation direction and a rotating frequency of the lens position rotating actuator.

18. A micro display projector comprising:

a micro display module according to any one of clauses 1 to 17; and a lens group, arranged facing the micro display module for receiving image light emitted from the micro display module.

19. The micro display projector according to clause 18, wherein a diameter of at least one lens of the lens group is not less than a diagonal line of the micro LED array area.

20. A micro display system comprising:

a micro display module according to any one of clauses 1 to 17, configured to emit image light from the micro LED array area; and a controlling unit, connected with the micro LED display device and the image light rotating element; wherein the controlling unit is configured to transmit objective image data to the micro LED display device and the image light rotating element.

21. The micro display system according to clause 20, wherein the image light rotating element further comprises an actuator controller, electrically connected with the lens position rotating actuator, configured to control a rotation direction and a rotating frequency of the lens position rotating actuator; and the controlling unit is connected with the IC back plane and the actuator controller, configured to transmit signals to the IC back plane and the actuator controller.

22. The micro display system according to clause 20, wherein the controlling unit is further configured to process the objective image data to form N pieces of sub-image data, calculate a rotation direction and a rotating frequency of the transmission lens for each sub-image data according to a refresh frequency of the objective image data, send the rotation direction and the rotating frequency to the actuator controller, and send the sub-image data and the rotating frequency to the IC back plane; wherein N is an integer and not less than two;

the actuator controller is configured to receive the rotation direction and the rotating frequency of the transmission lens for each sub-image data, and control the lens position rotating actuator and the transmission lens to perform a rotating process based on the rotation direction and the rotating frequency for each sub-image data; and the IC back plane is configured to synchronously control the micro display device to display a sub-image according to the sub-image data and the rotating frequency.

23. The micro display system according to clause 22, wherein, each of the pixel point in the micro LED array area is separately formed in a corresponding pixel area; each of the pixel area comprises N pieces of pixel sub-images; wherein, the pixel sub-images of a pixel point is shifted in a shifting order and in the pixel area of the pixel point; the N-pieces sub-images are shifted in a same shifting order with the pixel sub-images.

24. The micro display system according to clause 23, wherein the rotating frequency of sub-image data is M times of the refresh frequency of the objective image data; wherein M is an integer and not less than two.

15. The micro display system according to clause 24, wherein N is an even integer, and M is equal to N.

26. The micro display system according to clause 24, wherein the rotating frequency of the transmission lens is four times of the refresh frequency of the objective image data.

27. The micro display system according to clause 24, wherein the refresh frequency of the objective image data is 50-70 Hz.

28. The micro display system according to clause 24, wherein, the shifting direction is a clock wise direction.

29. The micro display system according to clause 23, wherein sub-images formed by the sub-image data are as same as the objective image formed by the objective image data.

30. The micro display system according to clause 29, wherein the gray-scale of at least one of the pixel sub-images of the same pixel point is not as same as the gray-scale of the objective pixel image of the same pixel point in the objective image data.

31. The micro display system according to clause 29, wherein the gray-scale of all of the pixel sub-images of the same pixel point is as same as the gray-scale of the objective pixel image of the same pixel point in the objective image data.

32. The micro display system according to clause 29, wherein, the relationship of the shifting distance of the sub-image from the objective image and the rotation angle of the transmission lens based on an axis is as follows:

$$\Delta y = t \sin \theta \left( 1 - \sqrt{\frac{1 - \sin^2 \theta}{n^2 - \sin^2 \theta}} \right);$$

wherein $\Delta y$ is the shifting distance, $\theta$ is the rotation angle, t is the center thickness of the transmission lens, n is the refraction ratio of the transmission lens.

33. The micro display system according to clause 32, wherein, the shifting distance between the adjacent pixel sub-images is 50-100% of the pixel pitch.

34. A micro image displaying method using the micro display system of clause 20, comprising:

step 101, obtaining at least one piece of objective image data;

step 102, processing one piece of the objective image data to form N pieces of sub-image data;

step 103, displaying the N pieces of the sub-image data in sequential to form N pieces of sub-images based on a rotating frequency and a preset rotation direction of a transmission lens for each sub-image data, wherein N is an integer and not less than two; and step 104, recycling the steps 102 to 103 until all of the objective image data displayed.

35. The micro image displaying method according to clause 34, wherein in the step 103, each of the pixel point in the micro LED array area is separately formed in a corresponding pixel area; each of the pixel area comprises N pieces of pixel sub-images; wherein, the pixel sub-images of a pixel point is shifted in a shifting order and in the pixel area of the pixel point; the N-pieces sub-images are shifted in a same shifting order with the pixel sub-images.

36. The micro image displaying method according to clause 35, wherein, in the step 103, a rotating frequency of the sub-image data is M times of the fresh frequency of the objective image data, wherein M is an integer and not less than two.

37. The micro image displaying method according to clause 36, wherein N is an even integer, and M is equal to N.

38. The micro image displaying method according to clause 37, wherein a rotating frequency of the transmission lens is four times of the refresh frequency of the objective image data.

39. The micro image displaying method according to clause 37, wherein, the refresh frequency of the objective image data is 50-70 Hz.

40. The micro image displaying method according to clause 35, wherein, the shifting direction is a clock wise direction.

41. The micro image displaying method according to clause 40, wherein sub-images formed by the sub-image data are as same as the objective image formed by the objective image data.

42. The micro image displaying method according to clause 41, wherein the gray-scale of at least one of the pixel sub-images of the same pixel point is not as same as the gray-scale of the objective pixel image of the same pixel point in the objective image data.

43. The micro image displaying method according to clause 41, wherein the gray-scale of all of the pixel sub-images of the same pixel point is as same as the gray-scale of the objective pixel image of the same pixel point in the objective image data.

44. The micro image displaying method according to clause 41, wherein the relationship of the shifting distance of the sub-image from the objective image and the rotation angle of the transmission lens based on an axis is as follows:

$$\Delta y = t \sin \theta \left( 1 - \sqrt{\frac{1 - \sin^2 \theta}{n^2 - \sin^2 \theta}} \right);$$

wherein Δy is the shifting distance, θ is the rotation angle, t is the center thickness of the transmission lens, n is the refraction ratio of the transmission lens.

45. The micro image displaying method according to clause 44, wherein the shifting distance between the adjacent pixel sub-images is 50-100% of the pixel pitch.

46. A micro image displaying method using the micro display system of clause 20, comprising:

step 201, obtaining at least one piece of objective image data;

step 202, processing each of the objective image data to form N pieces of sub-image data for each of the objective image data;

step 203, displaying the sub-image data of the first objective image data in sequential to form N pieces of sub-images based on a rotating frequency and a preset rotation direction of a transmission lens for each sub-image data, wherein N is an integer and not less than two; and step 204, recycling the steps 202 to 203 until all of the objective image data displayed.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

In the drawings and specification, there have been disclosed exemplary embodiments. However, many variations and modifications can be made to these embodiments. Accordingly, although specific terms are employed, they are used in a generic and descriptive sense only and not for purposes of limitation.

What is claimed is:

1. A micro display module, comprising:

a micro LED display device comprising at least one micro LED (light emitting diode) panel, wherein the at least one micro LED panel comprises an IC back plane and a micro LED array area having one or more micro LEDs, the micro LED array area is formed on the surface of the IC back plane and each of the micro LEDs is electrically connected with the IC (integrated circuit) back plane; and an image light rotating element comprising a transmission lens arranged facing the micro LED array area and a lens position rotating actuator configured to rotate the transmission lens based on at least one preset axis, wherein the preset axis is parallel to the micro LED array area.

2. The micro display module according to claim 1, wherein the lens position rotating actuator is further configured to rotate the transmission lens based on an X axis, and the X axis is parallel to the micro LED array area in a first direction.

3. The micro display module according to claim 2, wherein the lens position rotating actuator is configured to rotate the transmission lens based on a Y axis, and the Y axis is parallel to the micro LED array area in a second direction; and the first direction is not parallel with the second direction.

4. The micro display module according to claim 3, wherein the X axis is perpendicular to the Y axis.

5. The micro display module according to claim 1, wherein the micro LED display device comprises:

three monochrome micro LED panels;

an optical combination unit combining three color images into one objective image, wherein the three monochrome micro LED panels are arranged around the optical combination unit; and a supporting frame comprising a center chamber and four openings that are around the center chamber; wherein the optical combination unit is arranged in the center chamber, each of the three micro LED panels is fixed on an edge of three openings respectively, a fourth opening is used for transmitting image light outside, the fourth opening is arranged facing one of the three openings.

6. The micro display module according to claim 1, wherein the micro LED display device further comprises a top cover plane covering the micro LED panel.

7. The micro display module according to claim 6, wherein the top cover plane is a glass cover; and a gap is formed between the micro LED array area and the glass cover.

8. The micro display module according to claim 7, wherein a dimension of the micro LED is not more than five micro meters; and a diagonal line of the micro LED array area is not more than two inches.

9. The micro display module according to claim 1, wherein the transmission lens is an optical lens; and image light emitted from the micro LED array area passes through the transmission lens and is transmitted outside in a changeable direction corresponding to a rotating direction of the transmission lens.

10. The micro display module according to claim 9, wherein the micro display module further comprises an actuator controller, electrically connected with the lens position rotating actuator, configured to control a rotation direction and a rotating frequency of the lens position rotating actuator.

11. A micro display projector comprising:

a micro display module; and a lens group arranged facing the micro display module for receiving image light emitted from the micro display module;

wherein the micro display module comprises a micro LED display device comprising at least one micro LED (light emitting diode) panel, wherein the at least one micro LED panel comprises an IC back plane and a micro LED array area having one or more micro LEDs, the micro LED array area is formed on the surface of the IC back plane and each of the micro LEDs is electrically connected with the IC (integrated circuit) back plane; and an image light rotating element comprising a transmission lens arranged facing the micro LED array area and a lens position rotating actuator configured to rotate the transmission lens based on at least one preset axis, wherein the preset axis is parallel to the micro LED array area.

12. The micro display projector according to claim 11, wherein a diameter of at least one lens of the lens group is not less than a diagonal line of the micro LED array area.

13. A micro display system comprising:

a micro display module configured to emit image light from the micro LED array area, wherein the micro display module comprises a micro LED display device comprising at least one micro LED (light emitting diode) panel, wherein the at least one micro LED panel comprises an IC back plane and a micro LED array area having one or more micro LEDs, the micro LED array area is formed on the surface of the IC back plane and each of the micro LEDs is electrically connected with the IC (integrated circuit) back plane; and an image light rotating element comprising a transmission lens arranged facing the micro LED array area and a lens position rotating actuator configured to rotate the transmission lens based on at least one preset axis, wherein the preset axis is parallel to the micro LED array area; and a controlling unit connected with the micro LED display device and the image light rotating element; wherein the controlling unit is configured to transmit objective image data to the micro LED display device and the image light rotating element.

14. The micro display system according to claim 13, wherein the image light rotating element further comprises an actuator controller, electrically connected with the lens position rotating actuator, configured to control a rotation direction and a rotating frequency of the lens position rotating actuator; and the controlling unit is connected with the IC back plane and the actuator controller, configured to transmit signals to the IC back plane and the actuator controller.

15. The micro display system according to claim 13, wherein the controlling unit is further configured to process the objective image data to form N pieces of sub-image data, calculate a rotation direction and a rotating frequency of the transmission lens for each sub-image data according to a refresh frequency of the objective image data, send the rotation direction and the rotating frequency to the actuator controller, and send the sub-image data and the rotating frequency to the IC back plane; wherein N is an integer and not less than two;

the actuator controller is configured to receive the rotation direction and the rotating frequency of the transmission lens for each sub-image data, and control the lens position rotating actuator and the transmission lens to perform a rotating process based on the rotation direction and the rotating frequency for each sub-image data; and the IC back plane is configured to synchronously control the micro display device to display a sub-image according to the sub-image data and the rotating frequency.

16. The micro display system according to claim 15, wherein, each of the pixel point in the micro LED array area is separately formed in a corresponding pixel area; each of the pixel area comprises N pieces of pixel sub-images; wherein, the pixel sub-images of a pixel point is shifted in a shifting order and in the pixel area of the pixel point; the N-pieces sub-images are shifted in a same shifting order with the pixel sub-images.

17. The micro display system according to claim 16, wherein sub-images formed by the sub-image data are as same as the objective image formed by the objective image data.

18. The micro display system according to claim 17, wherein the gray-scale of at least one of the pixel sub-images of the same pixel point is not as same as the gray-scale of the objective pixel image of the same pixel point in the objective image data.

19. The micro display system according to claim 18, wherein the gray-scale of all of the pixel sub-images of the same pixel point is as same as the gray-scale of the objective pixel image of the same pixel point in the objective image data.

20. The micro display system according to claim 18, wherein the relationship of the shifting distance of the sub-image from the objective image and the rotation angle of the transmission lens based on an axis is as follows:

$$\Delta y = t \sin \theta \left( 1 - \sqrt{\frac{1 - \sin^2 \theta}{n^2 - \sin^2 \theta}} \right);$$

wherein $\Delta y$ is the shifting distance, $\theta$ is the rotation angle, t is the center thickness of the transmission lens, n is the refraction ratio of the transmission lens.

* * * * *